US008258554B2

(12) United States Patent
Meng et al.

(10) Patent No.: US 8,258,554 B2
(45) Date of Patent: Sep. 4, 2012

(54) PRESSURE DETECTOR AND PRESSURE DETECTOR ARRAY

(75) Inventors: Hsin- Fei Meng, Hsinchu (TW); Sheng-Fu Horng, Hsinchu (TW); Yu-Chiang Chao, Hsinchu (TW); Chun-Yu Chen, Hsinchu (TW); Wei-Jen Lai, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 124 days.

(21) Appl. No.: 12/785,998

(22) Filed: May 24, 2010

(65) Prior Publication Data
US 2011/0108936 A1 May 12, 2011

(30) Foreign Application Priority Data

Nov. 10, 2009 (TW) .............................. 98138016 A
Dec. 31, 2009 (TW) .............................. 98146231 A

(51) Int. Cl.
*H01L 29/84* (2006.01)
(52) U.S. Cl. ............... 257/254; 257/417; 257/E29.324
(58) Field of Classification Search ............ 257/40, 257/108, 254, 415, 417, E29.324; 438/50
See application file for complete search history.

(56) References Cited

U.S. PATENT DOCUMENTS

| | | | | |
|---|---|---|---|---|
| 3,470,318 | A | * | 9/1969 | Broderick et al. ............ 348/307 |
| 3,509,432 | A | * | 4/1970 | Aponick, Jr. et al. ........... 257/75 |
| 5,191,237 | A | | 3/1993 | Takebe |
| 6,012,336 | A | * | 1/2000 | Eaton et al. .................... 73/754 |
| 7,002,176 | B2 | | 2/2006 | Iechi et al. |
| 7,112,755 | B2 | | 9/2006 | Kitano et al. |
| 7,141,839 | B2 | | 11/2006 | Thomas et al. |
| 7,260,999 | B2 | | 8/2007 | Divigalpitiya et al. |
| 2008/0054875 | A1 | * | 3/2008 | Saito ........................... 324/71.5 |

(Continued)

FOREIGN PATENT DOCUMENTS

TW 200532854 1/1994

(Continued)

OTHER PUBLICATIONS

Someya et al. "Conformable, flexible, large-area networks of pressure and thermal sensors with organic transistor active matrixes" PNAS, vol. 102, No. 35, 2005, pp. 12321-12325.*

(Continued)

*Primary Examiner* — Jenny L Wagner
*Assistant Examiner* — Abbigale Boyle
(74) *Attorney, Agent, or Firm* — Peter F. Corless; Steven M. Jensen; Edwards Wildman Palmer LLP

(57) ABSTRACT

A pressure detector is disclosed having an organic transistor, a pressure-detecting layer and a first electrode. The organic transistor includes an emitter, an organic layer, a grid formed with holes, and a collector, the organic layer being sandwiched between the emitter and the collector. The pressure-detecting layer is formed on the organic transistor such that the collector is sandwiched between the organic layer and the pressure-detecting layer. The first electrode is formed on the pressure-detecting layer such that the pressure-detecting layer is sandwiched between the collector and the first electrode. The area of the active region of the pressure detector is determined by the overlapped area of the electrodes, thereby reducing the pitch of the electrodes and thus the size of the pressure detector.

12 Claims, 5 Drawing Sheets

U.S. PATENT DOCUMENTS

2008/0128681 A1* 6/2008 Meng et al. .............. 257/40
2009/0129031 A1* 5/2009 Someya et al. .............. 361/729
2009/0284398 A1* 11/2009 Shen et al. .............. 341/33

FOREIGN PATENT DOCUMENTS

TW 200939550 A * 9/2009

OTHER PUBLICATIONS

Someya et al. "A large-area, flexible pressure sensor matrix with organic field-effect transistors for artificial skin applications" PNAS, vol. 101, No. 27, 2004, pp. 9966-9970.*

Kawaguchi et al. "Cut-and-Paste Customization of Organic FET Integrated Circuit and Its Application to Electronic Artificial Skin". IEEE Journal of Solid-State Circuits, vol. 40, No. 1, 2005, pp. 177-185.*

Manunza et al., "Pressure sensing by flexible, organic, field effect transistors", Applied Physics Letters, vol. 89, 143502 (2006).

Noguchi et al., "Organic-transistor-based flexible pressure sensors using ink-jet-printed electrodes and gate dielectric layers", Applied Physics Letters, vol. 89, 253507 (2006).

Chao et al., "Low voltage active pressure sensor based on polymer space-charge-limited transistor", Applied Physics Letters, vol. 95, 253306 (2009).

* cited by examiner

PRESSURE DETECTOR AND PRESSURE DETECTOR ARRAY

CROSS-REFERENCES TO RELATED APPLICATIONS

This application claims under 35 U.S.C. §119(a) the benefit of Taiwanese Application Numbers 98138016 filed Nov. 10, 2009 and 98146231 filed Dec. 31, 2009, the entire contents of both of which are incorporated herein by their references.

BACKGROUND OF THE INVENTION

1. Field of the Invention

This invention relates to detectors, and more particularly, to pressure detectors.

2. Description of Related Art

Most modern electronic elements, such as integrated circuits, transistors, diodes, thin-film transistors for liquid crystal display driving circuits, and solar cells, are made by using inorganic silicon. Since the substrate and active region of these electronic elements are composed of silicon, the substrate of these electronic elements are rigid and difficult to bend, not working normally when rolled or folded.

Since deposition of organic material may take place at or near room temperature, if the inorganic silicon of the active region (channel layer) of elements in the electronic elements is replaced with an organic semiconductor material, the substrate of the electronic elements can be a flexible plastic substrate or a metal sheet. Such electronic elements are called flexible electronics.

The flexible electronics are defined as those electronic element products that are fabricated on a flexible substrate (for example, a plastic substrate or a metal sheet), and have a variety of characteristics, such as flexibility, low fabrication temperature and light-weight construction. Flexible electronics may be deposited on a plastic substrate, and may operate normally when bent and rolled. Flexible electronics have the advantages of being rollable, portable, and disposable, and can be fabricated in large sizes.

However, there are still some bottlenecks and problems in the application and development of the organic electronic elements and flexible pressure detectors and/or arrays and/or touch panels of flexible electronics.

Taiwanese Patent Application No. 200532854, "Organic vertical transistor and the fabrication method thereof," discloses how to fabricate an organic vertical transistor having a source/drain/gate and teaches the operation mechanism whereby an active layer of an organic semiconductor is controlled by the gate in a way similar to that of an ordinary organic field-effect transistor. However, the organic vertical transistor operates at high voltage and lacks a pressure-detecting function.

U.S. Pat. No. 7,002,176, "Vertical Organic Transistor," discloses a vertical organic transistor that is applicable to organic electronic elements only, and thus lacks a pressure-detecting function.

U.S. Pat. No. 5,191,237, "Field-Effect Transistor Type Semiconductor Sensor," discloses a field-effect transistor sensor that not only functions as a sensor but also changes variable resistance according to applied pressure and allows voltage to be applied to the gate of the field-effect transistor so as to modulate the current of the drain. Therefore, the amplitude of the external pressure may be estimated by the amplitude of the current of the drain. However, the field-effect transistor sensor of U.S. Pat. No. 5,191,237 comprises an ordinary inorganic field-effect transistor and thus cannot be fabricated on a flexible substrate for use in flexible electronics. The sensor is still an ordinary field-effect transistor, and does not belong to the art of organic electronic elements of flexible electronics and flexible pressure detectors.

U.S. Pat. No. 7,112,755, "Pressure-Sensitive Sensor," discloses a pressure sensor. The pressure sensor comprises a thin film configured to function as a pressure-sensing layer and formed from a mixture of plastic/rubber and conductive particles. However, electrodes of the pressure sensor are disposed between upper and lower substrates and comprise a plurality of upper electrodes and a lower electrode to thereby disadvantageously prevent miniaturization of the pressure sensor. The lower substrate of the pressure sensor is not an electrode, and thus the pressure sensor has limited application and cannot combine with organic electronic elements.

U.S. Pat. No. 7,260,999, "Force Sensing Membrane," discloses a pressure-sensing membrane, which is fabricated by using two electrodes that are crossed to each other in an passive way. However, leakage currents are generated between each small pressure unit. Therefore, the pressure sensing membrane has limited application and cannot combine with organic electronic elements.

U.S. Pat. No. 7,141,839, "Organic Semiconductor Sensor Device," discloses an organic sensor device, which uses an ordinary organic field-effect transistor as a pressure detector, wherein an organic layer is a sensing layer. However, the organic material is easily affected by external moisture and oxygen which can change the characteristics of the elements. The organic sensor device comprises an organic field-effect transistor and thus has to operate at high voltage to the detriment of standby time in practice.

"Pressure Sensing by Flexible, Organic, Field-effect Transistors," *Applied Physics Letter*, Volume 89, 143502 (2006), a non-patent document, discloses a flexible organic field-effect transistor. However, it still belongs to an art in which an ordinary organic field-effect transistor is used as a pressure sensor. The organic material is easily affected by external moisture and oxygen, which can change the characteristics of the elements. The flexible organic field-effect transistor comprises an organic field-effect transistor and thus has to operate at high voltage to the detriment of standby time in practice.

"Organic-Transistor-Based Flexible Pressure Sensors Using Ink-Jet-Printed Electrodes and Gate Dielectric Layers", *Applied Physics Letters*, Volume 89, 253507 (2006), another non-patent document, discloses an organic-transistor-based flexible pressure sensor, which uses an ordinary organic field-effect transistor in an array that has a designated position. However, in that the smallest unit of the whole area of the pressure sensor is the area that an organic field-effect transistor actually occupies, it is difficult to reduce the area of the pressure sensor. Moreover, the organic-transistor-based flexible pressure sensor, which comprises an organic field-effect transistor, needs to operate at high voltage to the detriment of standby time in practice.

Therefore, it is highly desirable to develop a flexible electronic element that may be fabricated on a flexible substrate, perform as a pressure detector and/or array and/or touch panel of flexible electronics, has the characteristics and functions of organic electronic elements and flexible detectors, and is capable of solving the drawbacks of the prior art, the drawbacks being that the organic detecting layer is readily affected by the surroundings, the organic field-effect transistor has too high of an operating voltage, and the size of the element area cannot be reduced.

SUMMARY OF THE INVENTION

In view of the above-mentioned problems of the prior art, the present invention provides a pressure detector, which includes an organic transistor, a pressure-detecting layer and a first electrode. The organic transistor has an emitter, an organic layer formed on the emitter, a grid formed in the organic layer and having holes, and a collector formed on the organic layer, allowing the organic layer to be sandwiched between the emitter and the collector. The pressure-detecting layer is formed on the organic transistor, allowing the collector to be sandwiched between the organic layer and the pressure-detecting layer. And, the first electrode is formed on the pressure-detecting layer, allowing the pressure-detecting layer to be sandwiched between the collector and the first electrode.

In an embodiment, the present invention further provides a pressure detector, which includes a substrate, an organic transistor formed on the substrate, and a pressure-detecting unit. The organic transistor has an emitter, an organic layer formed on the emitter, a grid formed in the organic layer and having holes, and a collector formed on the organic layer, allowing the organic layer to be sandwiched between the emitter and the collector. The pressure-detecting unit has a second electrode, a pressure-detecting layer formed on the second electrode, and a first electrode formed on the pressure-detecting layer, allowing the pressure-detecting layer to be sandwiched between the second electrode and the first electrode, wherein the pressure-detecting unit is electrically coupled with the organic transistor via the second electrode.

In an embodiment, the pressure detector may further include a carrier ancillary layer formed between the emitter and the organic layer. In an embodiment, the carrier ancillary layer is a hole injection layer.

In an embodiment, the organic transistor is a vertical organic transistor, such as a polymer space-charge-limited transistor.

In an embodiment having a pressure-detecting unit, the pressure-detecting unit may be formed on the substrate, allowing the second electrode to contact the substrate, and the second electrode to be electrically connected to the grid. Also, the emitter contacts the substrate, allowing the emitter to be sandwiched between the substrate and the organic layer. In an embodiment, the emitter is made of a material selected from the group consisting of Indium Tin Oxide, Al/MoO₃, metal oxide, and an alloy thereof.

On the other hand, since the pressure-detecting layer is used to endure external pressure and provide appropriate deformation, the pressure-detecting layer comprises an elastic polymer having conductive particles. When the pressure-detecting layer is pressed and has reduced volume, the pitch of the conductive particles in the pressure-detecting layer are reduced, resulting in an increase of the electrical conductivity of the pressure-detecting layer. Optionally, the distribution of the conductive particles is adjustable to thereby enable the conductive particles to separate further when the pressure-detecting layer is pressed, thereby decreasing the electrical conductivity of the pressure-detecting layer. The conductive particles selected from the group consisting of a powder of graphite, metal, and the combination thereof. The elastic polymer may comprise an elastic member such as silicon rubber.

In another aspect, the present invention further provides a pressure detector array, which includes a plurality of bit-lines, a plurality of word-lines and a plurality of the aforementioned pressure detectors of the present invention, the pressure detectors being located between and electrically coupled with the bit-lines and the word-lines. In an embodiment, the bit-lines are electrically coupled with the pressure detectors, and the word-lines are coupled with the first electrodes of the pressure detectors. Alternatively, the bit-lines are essentially composed of the grids of the pressure detectors, and the word-lines are essentially composed of the first electrodes of the pressure detectors.

In yet another embodiment, the emitters of the pressure detectors have a common electrode, which facilitates the fabrication process.

In the present invention, the pressure-detecting layer conducts its electrode voltage to the collector electrode and/or grid electrode of the organic transistor. The vertical organic transistor can provide a satisfactory operational effect at a 4V operating voltage, and can still work normally at an operating voltage of as low as 2V or 3V. Therefore, the pressure detector of the present invention may operate at a low voltage, unlike an ordinary organic field-effect transistor, which has to operate at a high voltage.

Moreover, the vertical organic transistor of the present invention has an active region whose area is decided by the overlapped area of the electrodes, thereby reducing the pitch of the electrodes and thus the size of the pressure detector. Since the electronic elements in the pressure detector of the present invention are vertical organic transistors, the present invention effectively reduces the surface area of the organic field-effect transistor. Thus, the pressure detector of the present invention can be fabricated on a flexible substrate, to form a flexible electronic pressure detector and/or array and/or touch panel.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects being readily understandable by those in the art after reading the disclosure of this specification. The present invention can also be performed or applied by different embodiments. The details of the specification may vary on the basis of different points and applications, and numerous modifications and variations can be devised without departing from the spirit of the present invention.

Figure 1:
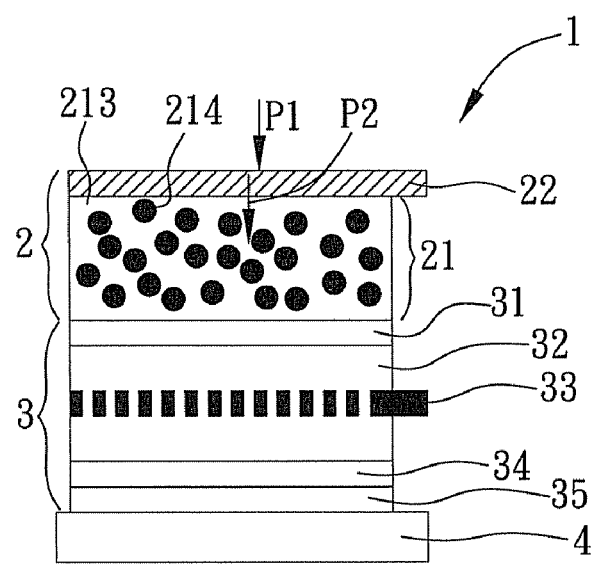
FIG. 1 shows a cross-sectional view of a pressure detector of the present invention.

FIG. 1 shows a pressure detector 1 of an embodiment according to the present invention. As shown in FIG. 1, the pressure detector 1 of the present invention comprises a pressure-detecting unit 2 and an organic transistor 3 such as a vertical organic transistor. The pressure-detecting unit 2 and the organic transistor 3 are combined in the vertical direction. The organic transistor 3 may be a polymer space-charge-limited transistor, for example. The pressure-detecting unit 2 comprises a pressure-detecting layer 21 and a first electrode 22. In an embodiment, the first electrode 22 may comprise aluminum, and the pressure-detecting layer 21 may be fabricated by mixing elastic polymer 213 such as silicon rubber with conductive particles 214 such as graphite particles. As shown in FIG. 1, a pressure-detecting layer 21 is sandwiched between a collector 31 of the organic transistor 3 and the first electrode 22 of the pressure-detecting unit 2.

As shown in FIG. 1, an organic transistor 3 is fabricated on a substrate 4. The organic transistor 3 comprises a collector electrode 31, an organic layer 32, a grid electrode 33 and an emitter electrode 35. The collector electrode 31 may comprise aluminum. The organic layer 32 may comprise organic polymer material such as P3HT, which is used as an active region of the organic transistor 3. The grid electrode 33 may comprise aluminum, and is used for adjusting and controlling a voltage distribution between the collector electrode 31 and the emitter electrode 35, and the operation of the active region. The pressure detector 1 may further comprise a carrier ancillary layer 34, formed between the emitter electrode 35 and the organic layer 32. The carrier ancillary layer 34 is a hole injection layer, comprised of a conductive polymer material such as PEDOT:PSS, and is used for facilitating the injection of holes into the organic layer 32. The emitter electrode 35 is fabricated from transparent electrode ITO or Al/MoO$_3$.

Referring to FIG. 1 again, when pressure P1 is applied from above to the first electrode 22, the first electrode 22 applies a pressure P2 to the pressure-detecting layer 21. Then, the pressure-detecting layer 21 is volumetrically compressed and the elastic polymer 213 such as silicon rubber is deformed. Accordingly, in an aspect, the pitch of the conductive particles 214 decreases, causing the electrical conductivity of the pressure-detecting layer 21 to increase. Optionally, the distribution of the conductive particles 214 is adjustable to thereby enable the conductive particles 214 to separate further when the pressure-detecting layer 21 is pressed, thereby decreasing the electrical conductivity of the pressure-detecting layer 21. The voltage of the first electrode 22 of the pressure-detecting unit 2 is conducted to the collector electrode 31 of the organic transistor 3, the organic transistor 3 located under the pressure-detecting unit 2 operating in an open or closed state in response to a bias voltage applied to the grid electrode 33. In other words, the voltage may be conducted to the collector electrode 31 due to the reduction of the volume of the pressure-detecting layer 21 and the resultant increase (or decrease) of the electrical conductivity, while the open or closed stated of the organic transistor 3 is controlled by the application of a bias voltage to the grid electrode 33. The vertical organic transistor of the present invention can provide a satisfactory operation effect at a 4V operating voltage, but can still work normally at an operating voltage of as low as 2V or 3V. Therefore, the pressure detector 1 of the present invention may operate at low voltage, unlike an ordinary organic field-effect transistor which has to operate at a relatively higher voltage.

Since the area of the active region constituted by the organic layer 32 of the organic transistor 3 is decided by the overlapped area of the electrodes, the vertical organic transistor 3 may be shrunk by shrinking the line width of each electrode, such as the collector electrode 31 and/or the grid electrode 33 and/or emitter electrode 35, the size of the pressure detector 1 being reduced accordingly.

The pressure-detecting unit 2 and the pressure detector of the organic transistor 3 may be fabricated on a flexible substrate, and used as a pressure detector and/or array and/or touch panel of a flexible electronic device.

Figure 2:
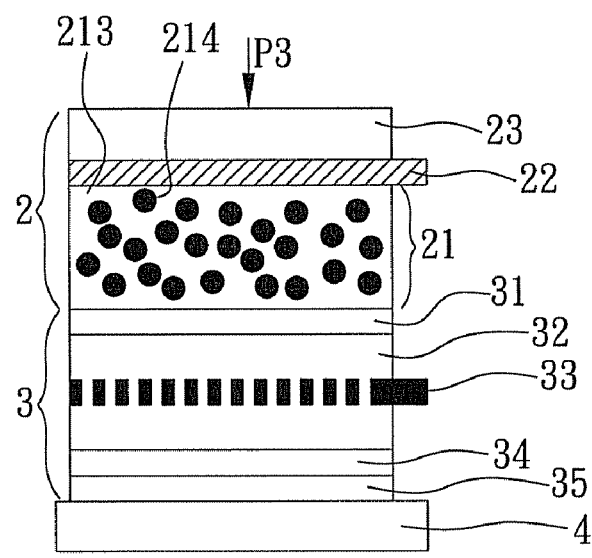
FIG. 2 shows a cross-sectional view of another pressure detector of the present invention.

FIG. 2 shows a pressure detector of another embodiment according to the present invention. As shown in FIG. 2, the pressure detector of the present embodiment comprises a pressure-detecting unit 2 and an organic transistor 3. The pressure-detecting unit 2 and the organic transistor 3 are combined in the vertical direction. The pressure-detecting unit 2 comprises the pressure-detecting layer 21, the first electrode 22, and a pressure-buffering layer 23 formed on top of the first electrode 22.

The purpose of putting the pressure-buffering layer 23 on the first electrode 22 is to prevent a pressure P3 from being applied to the first electrode 22 directly, so as not to affect the structure or input/output signals of the first electrode 22. However, the pressure-buffering layer 23 is not a necessary component for the pressure detecting mechanism. In practice, the pressure-buffering layer 23 is optionally included.

Figure 3A:
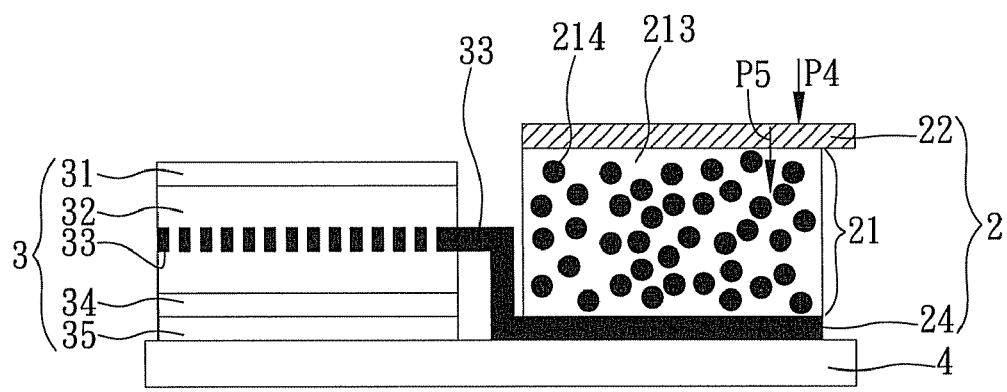
FIG. 3(a) shows a cross-sectional view of yet another pressure detector of the present invention.

FIG. 3(a) shows a pressure detector of yet another embodiment according to the present invention. As shown in FIG. 3(a), the pressure detector of the present embodiment comprises the pressure-detecting unit 2 and the organic transistor 3, wherein the pressure-detecting unit 2 and the organic transistor 3 are both formed on the substrate 4. In this embodiment, the organic transistor 3 may be, for example, a vertical polymer space-charge-limited transistor, and the pressure-detecting unit 2 comprises a pressure-detecting layer 21, a first electrode 22, and a second electrode 24. The electrodes are all composed of aluminum, wherein the second electrode 24 is formed and installed on the substrate 4 and contacts the substrate 4, and the pressure-detecting layer 21 comprises an elastic polymer having conductive particles. Furthermore, the second electrode 24 is electrically connected to a grid electrode 33 of the adjacent organic transistor 3.

As shown in FIG. 3(a), the organic transistor 3 is placed on the substrate 4, and comprises a collector electrode 31, an organic layer 32, the above-mentioned grid electrode 33 and an emitter electrode 35. The collector electrode 31 may comprise aluminum. The organic layer 32 may be constituted of a polymer material such as P3HT, for used as an active region of the organic transistor 3. The grid electrode 33 may also comprise aluminum, for adjusting and controlling the operation of the active region and the voltage distribution between the collector electrode 31 and the emitter electrode 35. Since the pressure-detecting layer 21 is electrically coupled to the grid electrode 33 via the second electrode 24, a variety of voltages (not shown) may be output via the pressure-detecting layer 21 to the grid electrode 33, so as to modulate the output current of the collector electrode 31 of the organic transistor 3. In this embodiment, the pressure detector may further comprise the carrier ancillary layer 34 such as a hole injection layer. The hole injection layer may comprise a polymer-typed conductive material such as PEDOT:PSS, for facilitating the injection of the holes into the organic layer 32. Note that the carrier ancillary layer 34 may be installed in the pressure detector as needed.

In this embodiment, when a pressure P4 is applied from above to the first electrode 22, the electrode 22 applies a pressure P5 to the pressure-detecting layer 21. Then, the pressure-detecting layer 21 is volumetrically compressed and the elastic polymer 213 is deformed. Accordingly, in an aspect, the pitch of the conductive particles 214 decreases, resulting in an increase of electrical conductivity of the pressure-detecting layer 21. Optionally, the distribution of the conductive particles 214 is adjustable to thereby enable the conductive particles 214 to separate further when the pressure-detecting layer 21 is pressed, thereby decreasing the electrical conductivity of the pressure-detecting layer 21. In that the voltage of the first electrode 22 of the pressure-detecting unit 2 is conducted to the second electrode 24, and the voltage of the first electrode 22 is indirectly conducted to the grid electrode 33 of the organic transistor 3 due to the electrical coupling of the second electrode 24 with the grid electrode 33 of the organic transistor 3, the organic transistor 3 may modulate the current of the collector electrode 31 using the variable voltage of the grid electrode 33. Therefore, when constant voltages are applied to the emitter electrode 35 and the collector electrode 31 of the organic transistor 3, the application of different pressure P5 to the pressure-detecting layer 21 may change the generated voltage of the grid electrode 33 and modulate the current of the collector electrode 31.

When an appropriate bias voltage is applied to the grid electrode 33, the organic transistor 3 may operate in an open or closed state. In other words, the organic transistor 3 may operate in the open or closed state by an electrical conductivity change following the volumetric compression of the pressure-detecting layer 21, voltage conduction of the second electrode 24 and the grid electrode 33, and modulation of the current of the collector electrode 31.

Since the area of the active region constituted by the organic layer 32 of the vertical organic transistor 3 of the present invention is decided by the overlapped area of the electrodes, the organic transistor 3 may be downsized, and the area of the pressure detector 1 may be reduced, by reducing the line width of each electrode, such as the collector electrode 31 and/or grid electrode 33 and/or emitter electrode 35.

Similarly, the pressure detector of the present invention that comprises the pressure-detecting unit 2 and the organic transistor 3 may be fabricated on a flexible substrate, for use as a pressure detector and/or array and/or touch panel of a flexible electronic device.

Figure 3B:
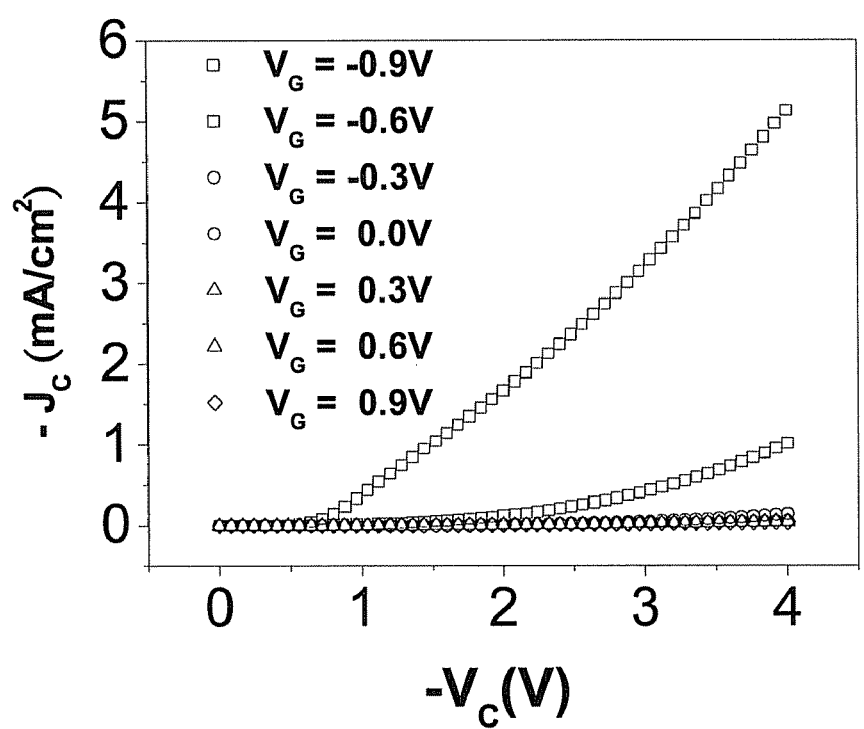
FIG. 3(b) is a characteristic graph illustrating the current and voltage of the space-charge-limited transistor shown in FIG. 3(a), where Jc represents the current density of a collector electrode, Vc represents the voltage of the collector electrode, and $V_G$ represents the voltage of the grid electrode.

Further refer to FIG. 3(b), which is a characteristic graph illustrating the current and voltage relationship of the space-charge-limited transistor shown in FIG. 3(a). As shown in FIG. 3(b), when a 4V voltage is applied to the collector electrode, the organic transistor 3 may operate in the open or closed state through the variation of the electric conductivity, by modulating the voltage of the grid electrode 33, or by the amplitude of the voltage. It can be seen that the vertical organic transistor may provide satisfactory operation effect at a 4V operating voltage, and can still work normally at an operating voltage of as low as 2V or 3V.

Figure 4A:
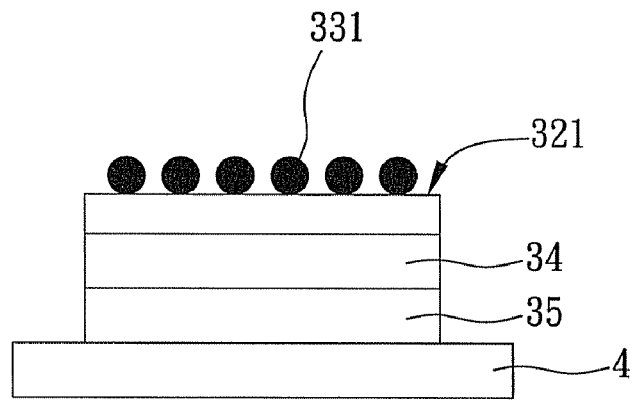
FIGS. 4(a) to 4(c) are flow charts illustrating the fabrication of the grid electrode of the organic transistor of the pressure detector of the present invention.
Figure 4B:
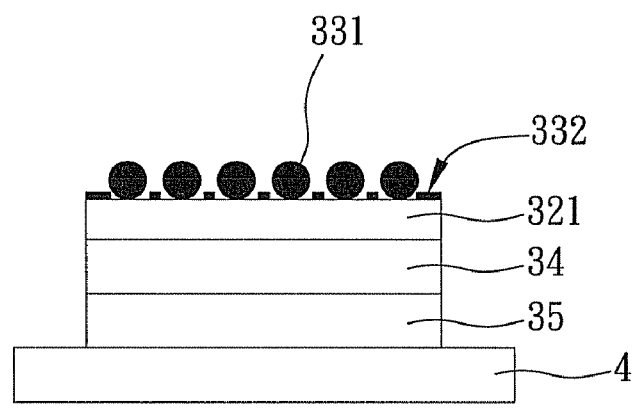
Figure 4C:
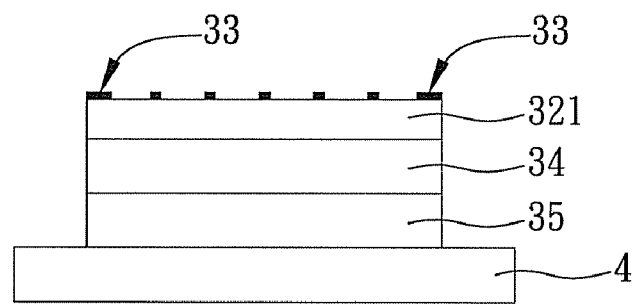

FIGS. 4(a) to 4(c) are flow charts illustrating the fabrication of a grid electrode of a vertical organic transistor of a pressure detector of the present invention. As shown in FIG. 4(a), an emitter electrode 35, a carrier ancillary layer 34 and an organic layer 321 are formed on the substrate 4 with a well-known process. Then, after nano-meter balls 331 are placed on the organic layer 321, the organic layer 321 on which the nano-meter balls are placed is evaporated and deposited with metal 332, the result being shown in FIG. 4(b). Since the vapor of the metal 332 moves linearly, the metal 332 is absent from wherever it is covered with the nano-meter balls 331, as shown in FIG. 4(c). After the nano-meter balls 331 are removed, dotted or segment-distributed holes are formed on the surface of the organic layer 321, and the metal 332 acts as the grid electrode 33. On the other hand, the dimensions of the holes, such as the diameter of the round holes, may be decided according to the size of the nano-meter balls 331. In an embodiment, the diameter of the holes is approximately 100 to 200 nm.

Figure 5:
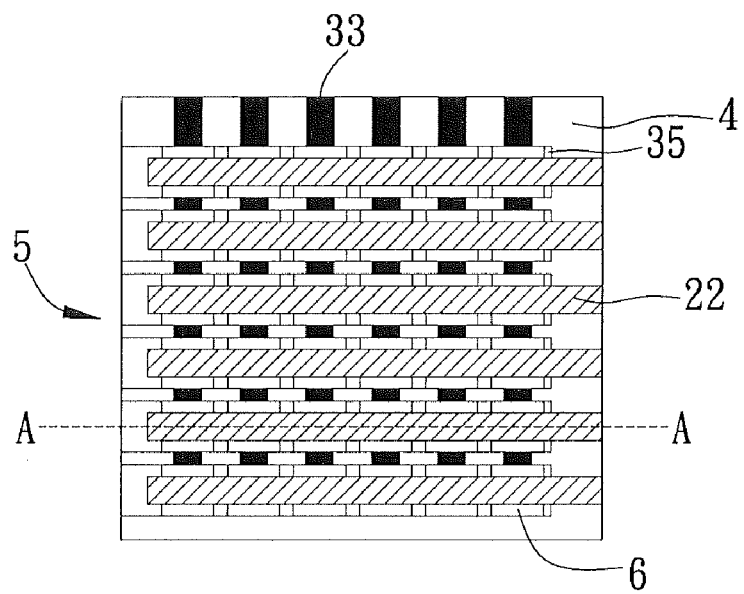
FIG. 5 is a cross-sectional view of a pressure detector array of the present invention.

FIG. 5 shows an array composed of a plurality of the pressure detectors of the present invention shown in FIG. 1. As shown in FIG. 5, the array 5 comprises a plurality of bit-lines 33'(33), a plurality of word-lines 22'(22) and a plurality of the pressure detectors 6 disposed on the substrate 4 and arranged in array. Each of the pressure detectors 6 is essentially disposed between and electrically coupled with the bit-lines 33' and the word-lines 22'. As shown in the drawings, the bit-lines 33' are electrically coupled with the grid electrodes of the pressure detectors 6 that are disposed in the direction of the bit-lines 33', and the word-lines 22' are coupled with the first electrodes of the pressure detectors 6 that are disposed in the direction of the word-lines 22'.

Figure 6:
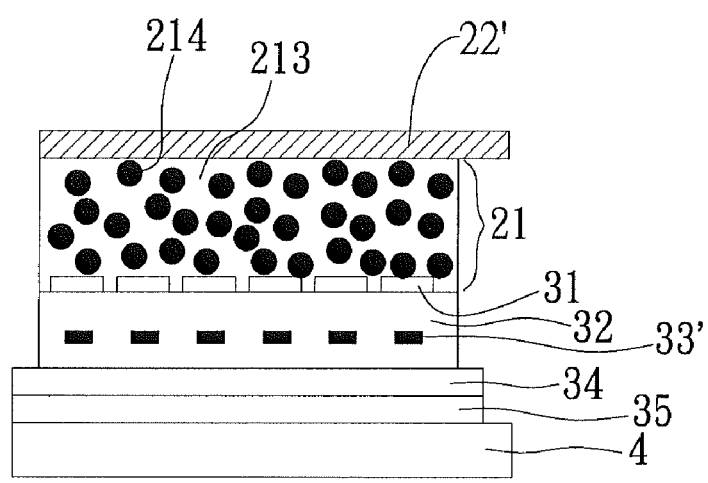
FIG. 6 is a cross-sectional view of the pressure detector array of the present invention shown in FIG. 5 along line A-A.

FIG. 6 shows a cross-sectional structure of the pressure detector array of the present invention shown in FIG. 5 along a line A-A. In the embodiment, the bit-lines 33' are essentially composed of the grid electrodes 33 of the pressure detectors 6, and the word-lines 22' are essentially composed of the first electrodes 22 of the pressure detectors 6, wherein, in the vertical direction of each separate one of the collector electrodes 31, a single pressure detector 6 is indicated. The characteristics and operations of the pressure detectors of FIGS. 7 and 2 are the same, and thus the working principles of the pressure detector of FIG. 7 are hereby omitted.

Figure 7:
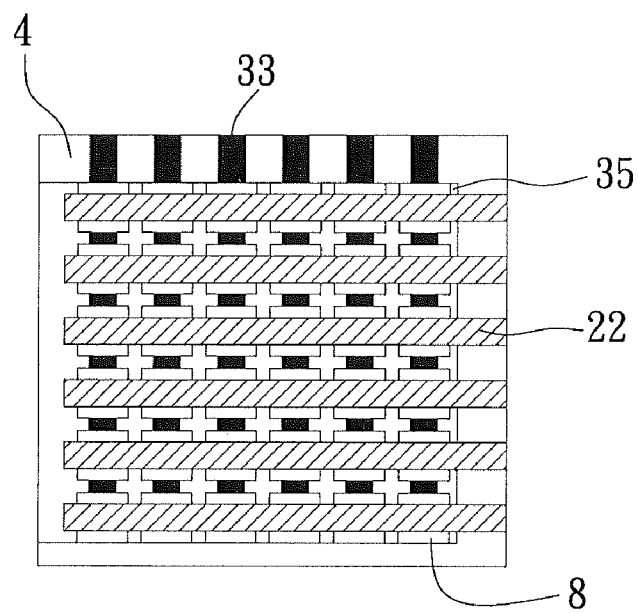
FIG. 7 is a cross-sectional view of a pressure detector array with a common electrode according to the present invention.

Referring to FIG. 7, in the embodiment, the pressure detector 8 has a structure similar to that of the pressure detector of FIG. 6, except that the emitter electrodes 35 of the pressure detector 8 have a common electrode. Therefore, it is more convenient to fabricate the pressure detector or array on the substrate.

Figure 8:
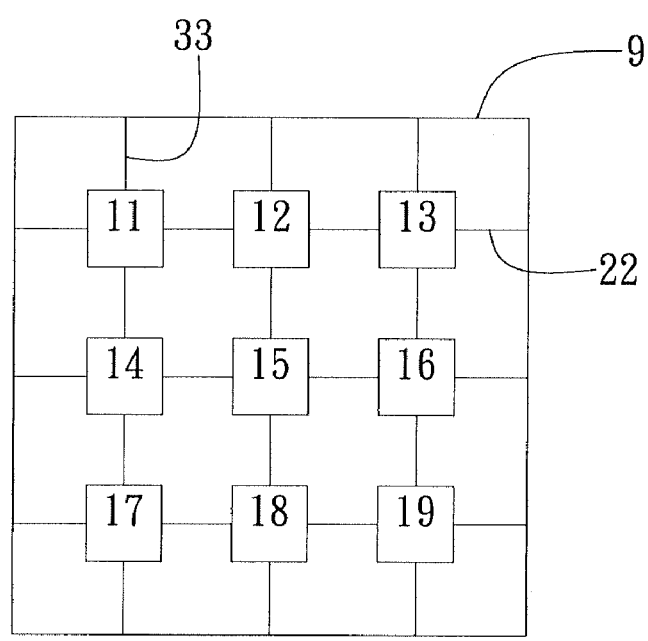
FIG. 8 is a block diagram illustrating an array composed of the pressure detector shown in FIG. 3 according to the present invention.

FIG. 8 is a structural diagram of an array constituted by the pressure detector shown in FIG. 3 according to the present invention. As described earlier, the array 9 comprises a plurality of bit-lines 33', a plurality of word-lines 22', and a plurality of the pressure detectors disposed on the substrate 4 and arranged in array. Each of the pressure detectors is located between and electrically coupled with the bit-lines 33' and the word-lines 22'. In particular, the array 9 is constituted by pressure-detecting units 11, 12, 13, 14, 15, 16, 17, 18 and 19 arranged in array. In an embodiment, the pressure-detecting units 11-19 may be the pressure detector of the present invention shown in FIG. 3; the bit-lines 33' are electrically coupled with the collector electrodes of the pressure-detecting units (such as, 11, 14 and 17) located in the direction of the bit-lines 33'; and the word-lines 22' are coupled with the first electrodes of the pressure-detecting units (such as, 11, 12 and 13) located in the direction of the word-lines 22'.

In summary, the pressure detector of the present invention is applied to a pressure detection environment. When the pressure-detecting layer in the pressure detector is applied with pressure and has its volume compressed, the electrical conductivity of the pressure-detecting layer varies. Since the area of the active region of the pressure detector depends on the overlapped area of the electrodes, the area of the pressure detector may be reduced by reducing the line width of the electrodes. The pressure detector of the present invention may be fabricated on a flexible substrate, and used as a pressure detector and/or array and/or touch panel of a flexible electronic device. The pressure detector of the present invention has the followings advantages.

1. It solves the problems that the organic detector layer is not affected by external members, and the organic field-effect transistor has too high an operating voltage.
2. The operating voltage of the pressure detector is reduced because of short channel length.
3. The area of the active region of the pressure detector depends on the overlapped area of the electrodes, and thus the area of the pressure detector can be reduced by reducing the line width of the electrodes, so as to reduce the area of the organic field-effect transistor.

The foregoing descriptions of the detailed embodiments are illustrated to disclose the features and functions of the present invention and are not restrictive of the scope of the present invention. It will be understood by those in the art that many modifications and variations can be made to the embodiments according to the spirit and principles in the disclosure of the present invention and yet still fall within the scope of the appended claims.

What is claimed is:

1. A pressure detector array, comprising:
   a plurality of pressure detectors, each of the pressure detectors comprising:
   an organic transistor having an emitter, an organic layer formed on the emitter, a grid formed in the organic layer and having holes, and a collector formed on the organic layer, allowing the organic layer to be sandwiched between the emitter and the collector;
   a pressure-detecting layer formed on the organic transistor, allowing the collector to be sandwiched between the organic layer and the pressure-detecting layer; and
   a first electrode formed on the pressure-detecting layer, allowing the pressure-detecting layer to be sandwiched between the collector and the first electrode;
   a plurality of bit-lines, essentially composed of the grids of the pressure detectors; and
   a plurality of word-lines, essentially composed of the first electrodes of the pressure detectors.

2. The pressure detector array of claim 1, wherein each of the pressure detectors further comprises a carrier ancillary layer formed between the emitter and the organic layer, the carrier ancillary layer being a hole injection layer.

3. The pressure detector array of claim 1, wherein the pressure-detecting layer comprises an elastic polymer having conductive particles selected from the group consisting of a powder of graphite, metal, and a combination thereof, the elastic polymer being silicon rubber.

4. The pressure detector array of claim 1, wherein the emitter is made of a material selected from the group consisting of Indium Tin Oxide and Al/MoO$_3$.

5. The pressure detector array of claim 1, wherein the pressure detectors have the emitters share a common electrode.

6. A pressure detector array, comprising:
   a plurality of pressure detectors, each of the pressure detectors comprising:
   a substrate;
   an organic transistor formed on the substrate, the organic transistor having an emitter, an organic layer formed on the emitter, a grid formed in the organic layer and having holes, and a collector formed on the organic layer, allowing the organic layer to be sandwiched between the emitter and the collector; and
   a pressure-detecting unit having a second electrode, a pressure-detecting layer formed on the second electrode, and a first electrode formed on the pressure-detecting layer, allowing the pressure-detecting layer to be sandwiched between the second electrode and the first electrode,
   wherein the pressure-detecting unit is electrically coupled to the organic transistor via the second electrode;
   a plurality of bit-lines, essentially composed of the grids of the pressure detectors; and
   a plurality of word-lines, essentially composed of the first electrodes of the pressure detectors.

7. The pressure detector array of claim 6, wherein each of the pressure detectors further comprises a carrier ancillary layer formed between the emitter and the organic layer, the carrier ancillary layer being a hole injection layer.

8. The pressure detector array of claim 6, wherein the pressure-detecting unit is formed on the substrate, allowing the second electrode to contact the substrate, and the second electrode to be electrically connected to the grid.

9. The pressure detector array of claim 6, wherein the pressure-detecting layer comprises an elastic polymer having conductive particles selected from the group consisting of powder of graphite, metal, and a combination thereof, the elastic polymer being silicon rubber.

10. The pressure detector array of claim 6, wherein the emitter contacts the substrate, allowing the emitter to be sandwiched between the substrate and the organic layer.

11. The pressure detector array of claim 6, wherein the emitter is made of a material selected from the group consisting of Indium Tin Oxide and Al/MoO$_3$.

12. The pressure detector array of claim 6, wherein the pressure detectors have the emitters share a common electrode.

* * * * *